US009609427B2

(12) United States Patent
Jeong et al.

(10) Patent No.: US 9,609,427 B2
(45) Date of Patent: Mar. 28, 2017

(54) USER TERMINAL APPARATUS, ELECTRONIC DEVICE, AND METHOD FOR CONTROLLING THE SAME

(71) Applicant: Samsung Electronics Co. Ltd., Suwon-si, Gyeonggi-do (KR)

(72) Inventors: Dae-yeon Jeong, Seongnam-si (KR); Young-sik Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 552 days.

(21) Appl. No.: 13/925,011

(22) Filed: Jun. 24, 2013

(65) Prior Publication Data

US 2014/0093100 A1    Apr. 3, 2014

(30) Foreign Application Priority Data

Sep. 28, 2012 (KR) .................. 10-2012-0109132

(51) Int. Cl.
*H03G 3/00* (2006.01)
*H04R 3/00* (2006.01)
*H04R 27/00* (2006.01)
*H04M 1/60* (2006.01)
*H03G 3/20* (2006.01)

(52) U.S. Cl.
CPC .......... *H04R 3/00* (2013.01); *H04M 1/6091* (2013.01); *H04R 27/00* (2013.01); *H03G 3/00* (2013.01); *H03G 3/001* (2013.01); *H03G 3/002* (2013.01); *H03G 3/20* (2013.01); *H04R 2227/003* (2013.01); *H04R 2420/07* (2013.01); *H04R 2430/01* (2013.01); *H04R 2499/13* (2013.01)

(58) Field of Classification Search
CPC ...... H03G 3/001; H03G 3/002; H03G 1/0088; H03G 3/00; H03G 1/02; H03G 3/32; H03G 3/20; H04R 2430/01
USPC .................................. 381/104–109
See application file for complete search history.

(56) References Cited

U.S. PATENT DOCUMENTS

| 7,283,635 | B1 | 10/2007 | Anderson et al. | |
|---|---|---|---|---|
| 7,428,310 | B2 * | 9/2008 | Park | 381/104 |
| 8,447,048 | B2 * | 5/2013 | Chen | H04N 5/60 381/104 |
| 8,761,414 | B2 * | 6/2014 | Asada | H04R 1/1041 381/104 |
| 2006/0149402 | A1 * | 7/2006 | Chung | H04S 7/307 700/94 |
| 2008/0181424 | A1 | 7/2008 | Schulein et al. | |

(Continued)

FOREIGN PATENT DOCUMENTS

KR        10-0808988 B1    2/2008
KR    10-2012-0009748 A    2/2012
(Continued)

*Primary Examiner* — Disler Paul
(74) *Attorney, Agent, or Firm* — Jefferson IP Law, LLP

(57) ABSTRACT

A user terminal apparatus connected to an electronic device, and a method thereof, are provided. The apparatus includes a communicator that performs communication with the electronic device, an audio processor that processes an audio source to be transmitted to the electronic device, and a controller that adjusts a sound level of the audio source based on a reference volume unit of the electronic device, and controls the adjusted audio source to be transmitted to the electronic device in a streaming method.

17 Claims, 10 Drawing Sheets

(56) References Cited

U.S. PATENT DOCUMENTS

| | | | |
|---|---|---|---|
| 2009/0190767 A1* | 7/2009 | Aaron | H03G 3/32 |
| | | | 381/57 |
| 2010/0157172 A1* | 6/2010 | Chen | H04N 5/60 |
| | | | 348/738 |
| 2011/0019839 A1 | 1/2011 | Nandury | |
| 2011/0069841 A1 | 3/2011 | Angeloff et al. | |
| 2011/0117851 A1 | 5/2011 | Kim | |
| 2012/0172022 A1 | 7/2012 | Son et al. | |
| 2013/0289983 A1* | 10/2013 | Park et al. | 704/235 |
| 2013/0305152 A1* | 11/2013 | Griffiths | G06F 3/04883 |
| | | | 715/716 |
| 2013/0322648 A1* | 12/2013 | Chukka et al. | 381/77 |

FOREIGN PATENT DOCUMENTS

| | | |
|---|---|---|
| KR | 10-2012-0078813 A | 7/2012 |
| WO | 00/42797 A1 | 7/2000 |

\* cited by examiner

USER TERMINAL APPARATUS, ELECTRONIC DEVICE, AND METHOD FOR CONTROLLING THE SAME

PRIORITY

This application claims the benefit under 35 U.S.C. §119 (a) to a Korean patent application filed on Sep. 28, 2012 in the Korean Intellectual Property Office and assigned Serial No. 10-2012-0109132, the entire disclosure of which is incorporated herein by reference.

BACKGROUND OF THE INVENTION

1. Field of the Invention

The present invention relates to a user terminal apparatus, an electronic device, and a method for controlling the same. More particularly, the present invention relates to a user terminal apparatus, an electronic device, and a method for controlling the same, which can share content.

2. Description of the Related Art

With the development of electronic technology, various types of display devices have been developed. In particular, display devices, such as a TeleVision (TV), a Personal Computer (PC), a laptop computer, a tablet PC, a mobile phone, and a digital audio player, have become ubiquitous.

Recently, in order to meet the needs of users who desire new and diverse functions, methods for sharing content between different devices have been developed.

As an example, there is a related-art method for sharing audio streams between different devices. This related-art method is not a method in which one device accesses another device that stores audio data, decodes and outputs the audio data, but rather is a method in which audio data is transmitted in real time to the other device using a small network packet.

In the case of the system for sharing the audio streams, there is a need for schemes for providing an optimum volume size to a user through a reflection of volume sizes between the devices in the system.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention have been made to address at least the above-mentioned problems and or disadvantages and to provide at least the advantages described below. Accordingly, an aspect of the present invention is to provide a user terminal apparatus, an electronic device, and a method for controlling the same, which can provide an audio source with an adjusted sound level in consideration of the sound level of a device that receives the audio source.

According to one aspect of the present invention, a user terminal apparatus connected to an electronic device is provided. The apparatus includes a communicator that performs communication with the electronic device, an audio processor that processes an audio source to be transmitted to the electronic device, and a controller that adjusts a sound level of the audio source based on a reference volume unit of the electronic device, and controls the adjusted audio source to be transmitted to the electronic device in a streaming method.

The audio processor may include a sound measurer that measures a level of a standard sound received from the electronic device, and the controller may determine the reference volume unit based on a measurement value measured by the sound measurer and adjust the sound level of the audio source based on the determined reference volume unit.

The communicator may receive the reference volume unit transmitted from the electronic device before transmitting the audio source to the electronic device, and the controller may adjust the sound level of the audio source based on the received reference volume unit.

The user terminal apparatus according to the aspect of the present invention may further include a memory that maps and stores device identification information and the reference volume unit, wherein, if the identification information is received from the electronic device, the controller searches for the reference volume unit that is mapped on the identification information in the memory, and adjusts the sound level of the audio source based on a found reference volume unit.

According to another aspect of the present invention, an electronic device connected to a user terminal apparatus is provided. The device includes a communicator that performs communication with the user terminal apparatus, an audio outputter that outputs an audio signal, and a controller that operates to receive an audio source, of which a sound level has been adjusted based on a reference volume unit of the electronic device, from the user terminal apparatus in a streaming method, and to output the received audio source.

The controller may operate to transmit a standard sound to determine the reference volume unit to the user terminal apparatus, and to receive the audio source, of which the sound level has been adjusted based on the reference volume unit determined according to a measurement value of the standard sound, from the user terminal apparatus.

The controller may operate to receive the audio source in a Real time Transport Protocol (RTP) packet form, and to transmit the standard sound using a User Datagram Protocol (UDP) packet before the audio source is received.

The electronic device according to the aspect of the present disclosure may further include a memory that stores the reference volume unit, wherein the controller operates to transmit the reference volume unit stored in the memory to the user terminal apparatus, and to receive the audio source, of which the sound level has been adjusted based on the reference volume unit, from the user terminal apparatus.

The controller may operate to transmit identification information of the electronic device to the user terminal apparatus, and to receive the audio source, of which the sound level has been adjusted based on the reference volume unit determined by the identification information, from the user terminal apparatus.

The electronic device may be a head unit device of a vehicle, and the user terminal apparatus may be a mobile terminal.

According to still another aspect of the present invention, a method for controlling a user terminal apparatus connected to an electronic device is provided. The method includes performing communication with the electronic device, adjusting a sound level of an audio source based on a reference volume unit of the electronic device, and transmitting the audio source, of which the sound level has been adjusted, to the electronic device in a streaming method.

The adjusting of the sound level of the audio source may include measuring a level of a standard sound received from the electronic device, determining the reference volume unit based on the measured measurement value, and adjusting the sound level of the audio source based on the determined reference volume unit.

The adjusting of the sound level of the audio source may include receiving the reference volume unit transmitted from the electronic device, and adjusting the sound level of the audio source based on the received reference volume unit.

The adjusting of the sound level of the audio source may include receiving identification information from the electronic device, searching for the reference volume unit that is mapped on the identification information, and adjusting the sound level of the audio source based on a found reference volume unit.

According to still another aspect of the present disclosure, a method for controlling an electronic device connected to a user terminal apparatus is provided. The method includes performing communication with the user terminal apparatus, receiving an audio source, of which a sound level has been adjusted based on a reference volume unit of the electronic device, from the user terminal apparatus in a streaming method, and outputting the received audio source.

The method for controlling an electronic device according to the aspect of the present disclosure may further include transmitting a standard sound to determine the reference volume unit to the user terminal apparatus, wherein the receiving of the audio source includes receiving the audio source of which the sound level has been adjusted based on the reference volume unit determined according to a measurement value of the standard sound.

The receiving of the audio source may include receiving the audio source in an RTP packet form, and the transmitting of the standard sound to the user terminal apparatus may include transmitting the standard sound using a UDP packet before the audio source is received.

The method for controlling an electronic device according to the aspect of the present disclosure may further include transmitting the reference volume unit to the user terminal apparatus, wherein the receiving of the audio source includes receiving the audio source of which the sound level has been adjusted based on the transmitted reference volume unit.

The method for controlling an electronic device according to the aspect of the present disclosure may further include transmitting identification information of the electronic device to the user terminal apparatus, wherein the receiving the audio source includes receiving the audio source of which the sound level has been adjusted based on the reference volume unit determined by the identification information.

The electronic device may be a head unit device of a vehicle, and the user terminal apparatus may be a mobile terminal.

As described above, according to aspects of the present invention, audio shock problems that may occur during sharing of audio streams between different devices can be addressed. For example, in the case where the volume unit of the received audio stream is higher than the volume unit of an output device, sound that is higher than user's expected sound level can be prevented from being outputted.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of the present invention will be more apparent from the following detailed description when taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
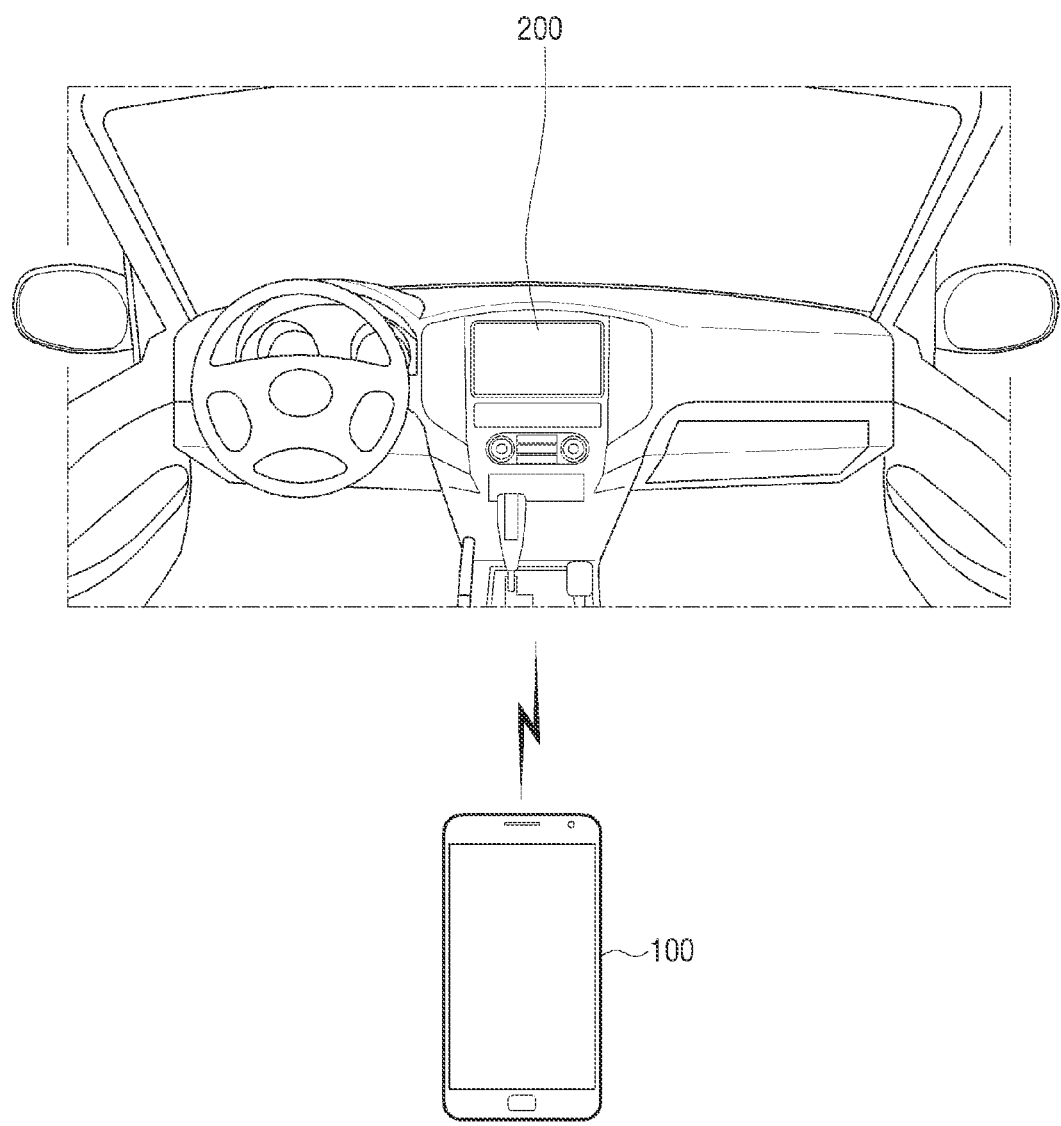
FIG. 1 is a view explaining a configuration of a content sharing system according to an exemplary embodiment of the present invention.

FIG. 1 is a view explaining a configuration of a content sharing system according to an exemplary embodiment of the present invention.

Referring to FIG. 1, a content sharing system includes a user terminal apparatus 100 and an electronic device 200.

The user terminal apparatus 100 may be implemented by any of various types of devices, such as a mobile phone, a Personal Digital Assistant (PDA), a Personal Computer (PC), a notebook PC, a tablet PC, a digital audio player, etc.

In particular, the user terminal apparatus 100 may transmit various types of content, such as video content and audio content, to the electronic device 200 by performing communication with the electronic device 200.

In this case, the electronic device 200 functions to output the content received from the user terminal apparatus 100 through a display and/or a speaker. In particular, the electronic device 200 may output the content that is streamed in real time from the user terminal apparatus 100.

According to one implementation example of the present invention, the user terminal apparatus 100 and the electronic device 200 may adopt mirror link technology that supports a connection between a smart phone and a vehicle infotainment system. Here, the mirror link refers to standards supporting video, audio, and control transmission based on Vehicle Area Network (VNA) protocols, and the vehicle infotainment system may be any of various systems for a vehicle, such as a head unit, a rear seat entertainment device, a radio set, navigation, etc.

That is, by applying the mirror link technology, applications installed in the smart phone or communication services can be used in the vehicle infotainment system, for example, the head unit. For example, main functions of the smart phone, such as web browsing, navigation, multimedia reproduction, and engaging in a phone call, can be implemented in the head unit. More specifically, according to the mirror link technology, the smart phone serves as a server that takes charge of installation and operation of all applications, and the vehicle head unit operates as a client. On the other hand, in order to implement the mirror link in the vehicle infotainment system, both the vehicle infotainment and the smart phone should support the mirror link. Since other functions of the mirror link are well known, an explanation thereof will be omitted.

However, application of the present invention is not limited thereto, but the user terminal apparatus 100 and the electronic device 200 according to the present invention can be applied to various systems in which different devices are connected to each other, and audio content is transmitted from one device to the other device, so that the audio content is output through the other device.

On the other hand, the user terminal apparatus 100 may provide an audio source to the electronic device 200 in a streaming method.

More specifically, the user terminal apparatus 100 may adjust a sound level of the audio source based on a reference sound unit of the electronic device 200 and stream the adjusted audio source to the electronic device 200. Here, the reference volume unit may be a volume that corresponds to a Volume Unit (VU; or dB decibel (dB)) at an audio output terminal of the electronic device 200, for example, volume level 1.

The electronic device 200 may receive the audio source, of which the sound level has been adjusted based on the reference volume unit of the electronic device 200, from the user terminal apparatus 100 in a streaming method and output the received audio source.

Hereinafter, a method for adjusting the sound level of the audio source in the user terminal apparatus 100 and the corresponding operation of the electronic device 200 will be described in detail.

Figure 2A:
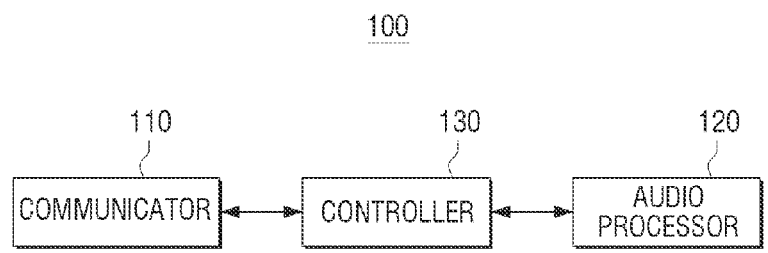
FIG. 2A is a block diagram illustrating a configuration of a user terminal apparatus according to an exemplary embodiment of the present invention.

FIG. 2A is a block diagram illustrating a configuration of a user terminal apparatus according to an exemplary embodiment of the present invention.

According to the configuration illustrated in FIG. 2A, the user terminal apparatus 100 includes a communicator 110, an audio processor 120, and a controller 130.

The communicator 110 performs communication with the electronic device 200. The controller 130 controls the operation of the user terminal apparatus 100.

More specifically, the communicator 110 may perform communication with the electronic device 200 according to various wired/wireless communication methods, such as Wireless Fidelity (Wi-Fi), Bluetooth, Universal Serial Bus (USB), etc.

The audio processor 120 adjusts the sound level of an audio source to be streamed to the electronic device 200. Here, the audio source may be audio content which is pre-stored in the user terminal apparatus 100 or is received from outside the user terminal apparatus 100.

More specifically, the audio processor 120 may process the audio source to be streamed to the electronic device 200 under the control of the controller 130. More specifically, the audio processor 120 may adjust the sound level of the audio source to be streamed to the electronic device 200 based on a reference volume unit determined by the controller 130. For example, the audio processor 120 may include a volume normalizing module to normalize the sound level of the audio source to be output to the electronic device 200 with the same level as the determined reference volume unit. Here, adjustment of the sound level may include adjustment of the sound level to the closest level if the adjustment to an equal sound level is difficult.

In this case, the reference volume unit of the electronic device 200 may be acquired in any of various methods, such as any of the following three methods, namely a first method in which a standard sound is received from the electronic device 200, a second method in which a reference volume unit is received from the electronic device 200, and a third method in which identification information is received from the electronic device 200.

In the first method, the user terminal apparatus 100 may receive a standard sound for determining the reference volume unit of the electronic device 200 before streaming the audio source. Here, the standard sound may be a volume unit of the electronic device 200. For example, the standard sound may be sound that corresponds to volume level 1, and for example, may be a sound having a constant sound level, such as a beep sound.

In the first method, the audio processor 120 may determine the reference volume unit of the electronic device 200 based on the measurement value measured by the sound measurer, and adjust the sound level of the audio source based on the determined reference volume unit.

In the second method, the electronic device 200 knows its own reference volume unit, and the user terminal apparatus 100 may receive the reference volume unit from the electronic device 200. Here, it is not necessary for the user terminal apparatus 100 to receive and measure the standard sound.

In the second method, the controller 130 may adjust the sound level of the audio source based on the reference volume unit received from the electronic device 200.

In the third method, the user terminal apparatus 100 stores device identification information that is mapped on the reference volume unit, and the user terminal apparatus 100 may receive only the identification information from the electronic device 200. For example, the third method may correspond to the case where the user terminal apparatus 100 and the electronic device 200 perform communication according to the first and second methods as described above and the reference volume unit of the electronic device 200 is stored in the user terminal apparatus 100.

In the third method, if the identification information is received from the electronic device 200, the controller 130 may search for the reference volume unit that is mapped on the received identification information and adjust the sound level of the audio source based on the found reference volume unit.

However, in the above-described exemplary embodiment, it is exemplified that the audio processor 120 is a constituent element provided separately from the controller 130. However, this is exemplary, and it is also possible to implement the audio processor 120 integrally with the controller 130. That is, according to an exemplary embodiment of the present invention, the configuration to adjust the sound level of the audio source to be streamed to the electronic device 200 may be implemented as one configuration of the controller 130.

In audio streaming between the user terminal apparatus 100 and the electronic device 200, a Real time Transport Protocol (RTP)/RTP Control Protocol (RTCP) protocol may be used. However, any protocol that supports the protocol supporting real time communication is applicable with no limits.

According to the RTP/RTCP protocol, an audio or video source is sampled to be converted into a digital form, the sampled data is encapsulated to an RTP packet, and the RTP packet is encapsulated to a network transfer protocol such as User Datagram Protocol (UDP). Then, the network transfer protocol is encapsulated to an Internet Protocol (IP) packet, and the IP packet is again encapsulated to a connection layer protocol to be transmitted.

That is, the user terminal apparatus 100 may encode in real time the audio source of which the sound level has been adjusted according to the reference volume unit of the electronic device 200, and transmit the audio source in the RTP packet form to the electronic device 200 by applying the RTP protocol. In this case, the electronic device 200 decodes the received RTP packet, stores the decoded RTP packet in a buffer according to the order designated by the RTP protocol, and then outputs the RTP packet.

Figure 2B:
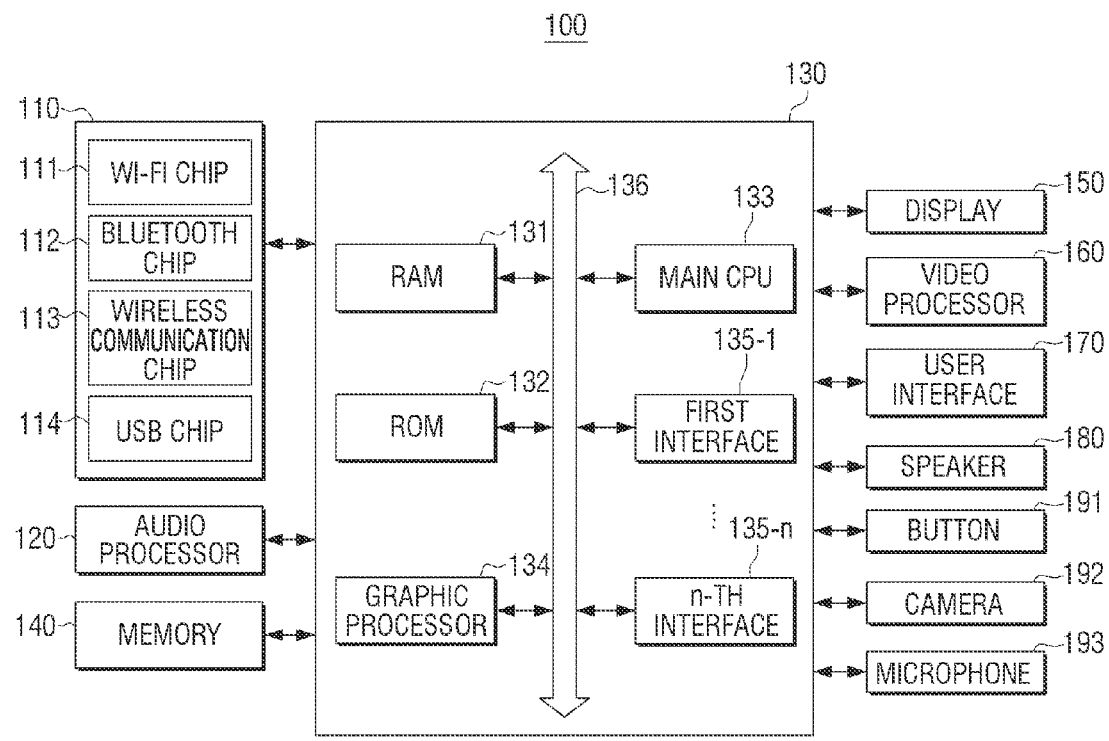
FIG. 2B is a block diagram illustrating a detailed configuration of a user terminal apparatus, such as the user terminal apparatus illustrated in FIG. 2A, according to an exemplary embodiment of the present invention.

FIG. 2B is a block diagram illustrating a detailed configuration of a user terminal apparatus, such as the user terminal apparatus illustrated in FIG. 2A, according to an exemplary embodiment of the present invention.

Referring to FIG. 2B, the user terminal apparatus 100 includes a communicator 110, an audio processor 120, a controller 130, a memory 140, a display 150, a video processor 160, a user interface 170, a speaker 180, a button 191, a camera 192, and a microphone 193. With respect to portions that are duplicate to the constituent elements illustrated in FIG. 2A among the constituent elements illustrated in FIG. 2B, a detailed explanation thereof will be omitted.

However, FIG. 2B shows an example of the detailed configuration included in the user terminal apparatus 100, and according to the exemplary embodiments, a part of the constituent elements illustrated in FIG. 2B may be omitted or changed, and other constituent elements may be further added. For example, the user terminal apparatus 100 may further include a Global Positioning System (GPS) receiver (not illustrated) which receives a GPS signal from a GPS satellite and calculates the current location of the user terminal apparatus 100 and/or a Digital Multimedia Broadcasting (DMB) receiver (not illustrated) which receives and processes a DMB signal.

The communicator 110 is a configuration that performs communication with various types of external devices according to various types of communication methods. The communicator 110 may include various communication chips, such as a Wi-Fi chip 111, a Bluetooth chip 112, a wireless communication chip 113, a USB chip 114, etc.

The Wi-Fi chip 111 and the Bluetooth chip 112 respectively perform communication in a Wi-Fi method and in a Bluetooth method. The wireless communication chip 113 denotes a chip that perform communication according to various communication standards, such as Institute of Electrical and Electronics Engineers (IEEE), ZigBee, 3rd Generation (3G), 3rd Generation Partnership Project (3GPP), 4th Generation (4G), Long Term Evolution (LTE), etc. The USB chip 114 may perform communication with various kinds of external devices through a USB cable or may perform charging. In addition, the communicator 110 may further include a Near Field Communication (NFC) chip which operates in an NFC method that uses a band of 13.56 MHz among various Radio Frequency-IDentification (RF-ID) frequency bands, such as 135 kHz, 13.56 MHz, 433 MHz, 860 to 960 MHz, and 2.45 GHz.

The audio processor 120 may process the audio source that is streamed to the electronic device 200 as described above.

Further, the audio processor 120 may perform processing, such as decoding, amplification, and noise filtering, with respect to various audio signals.

The operation of the controller 130 as described above may be performed by a program stored in the memory 140. The memory 140 may store an Operating System (OS) software module for driving the user terminal apparatus 100, various kinds of applications, various kinds of data input or set during execution of the applications, and various pieces of data such as content.

In particular, according to an exemplary embodiment of the present invention, the memory 140 may store information on reference volume units matched by identification information of external devices. More specifically, the memory 140 may store the identification information of the electronic device 200 that is mapped on the reference volume unit. For example, information mapped in the form of "device 001"="reference volume: 1 dB" may be stored. Although such information can be stored based on the case where the existing audio data transmission is performed as described above, it is also possible to receive and store the corresponding information in a related server (not illustrated). For example, it is also possible for a service providing server (for example, electronic product providing server) that manages the corresponding information to receive and store the prepared mapping information. In this case, different mapping information may be stored by versions even in the case of the same product.

Further, the memory 140 may store various audio sources to be streamed to the electronic device 200.

In addition, various software modules stored in the memory 140 will be described later with reference to FIG. 3.

The display 150 displays a screen. Here, the screen may include an application execution screen including various objects, such as images, moving images, and text, and a Graphic User Interface (GUI) screen.

The video processor 160 is a constituent element that processes video data.

For example, the video processor 160 may perform various image processes, such as encoding, scaling, noise filtering, frame rate conversion, and resolution conversion for the video data to be streamed from the electronic device 200.

The user interface 170 receives various user commands. For example, the user interface 170 may receive user commands for performing communication with the electronic device 200.

The speaker 180 is a constituent element that outputs not only various kinds of audio data processed by the audio processor 120 but also various kinds of beep sounds or voice messages.

The button 191 may include various types of buttons, such as mechanical buttons, a touch pad, a wheel, which are formed on a certain region, such as a front portion, a side portion, or a back portion of a main body of the user terminal apparatus 100. For example, a button for turning on/off power supply of the user terminal apparatus 100 may be provided. Here any number of the button 191 may be provided with the user terminal apparatus 100.

The camera 192 is a configuration to capture a still image or a moving image under the control of a user. A plurality of cameras 192, such as a front camera and a back camera, may be implemented.

The microphone 193 is a configuration to receive an input of user voice or other sound and convert the input sound into audio data. The controller 130 may use the user voice input through the microphone 193 in a call process, or may convert the user voice into audio data to store the audio data in the memory 140.

In the case where the camera 192 and the microphone 193 are provided, the controller 130 may perform control operation depending on the user's voice input through the microphone 193 or user's motion recognized by the camera 192. That is, the user terminal apparatus 100 may operate in a motion control mode or in a voice control mode. In the case of operating in the motion control mode, the controller 130 activates the camera 193 to capture an image of the user, tracks the change of the user's motion, and performs the corresponding control operation. In the case of operating in the voice control mode, the controller 130 may operate in the voice recognition mode in which the controller 130 analyzes the user's voice input through the microphone and performs a control operation depending on the analyzed user voice.

In addition, various external input ports for connecting to various external terminals, such as a headset, a mouse, and a Local Area Network (LAN), may be provided.

On the other hand, the controller 130 generally controls the operation of the user terminal apparatus 100 using various kinds of programs stored in the memory 140.

For example, the controller 130 may execute an application stored in the memory 140 and display an execution screen, or may reproduce various kinds of content stored in the memory 140. Further, the controller 130 may perform communication with the electronic device 200 through the communicator 110.

More specifically, the controller 130 includes a Random Access Memory (RAM) 131, a Read Only Memory (ROM) 132, a main Central Processing Unit (CPU) 133, a graphic processor 134, first to n-th interfaces 135-1 to 135-n, and a bus 136.

The RAM 131, the ROM 132, the main CPU 133, the graphic processor 134, and the first to n-th interfaces 135-1 to 135-n may be connected to each other through the bus 136.

The first to n-th interfaces 135-1 to 135-n are connected to the various constituent elements as described above. One of the interfaces may be a network interface that is connected to the electronic device 200 through a network.

The main CPU 133 performs booting using the OS stored in the memory 140 by accessing the memory 140. Then, the main CPU 133 performs various operations using various kinds of programs, content, and data stored in the memory 140.

In the ROM 132, a command set for system booting is stored. If a turn-on command is input and the power is supplied, the main CPU 133 copies the OS stored in the memory 140 into the RAM 131 according to the command stored in the ROM 132, and boots the system by executing the OS. If the booting is completed, the main CPU 133 copies various kinds of application programs stored in the memory 140 into the RAM 131, and performs various kinds of operations by executing the application programs copied into the RAM 131.

The graphic processor 134 creates a screen including various objects, such as icons, images, and text, using an operator (not illustrated) and a renderer (not illustrated).

Figure 3:
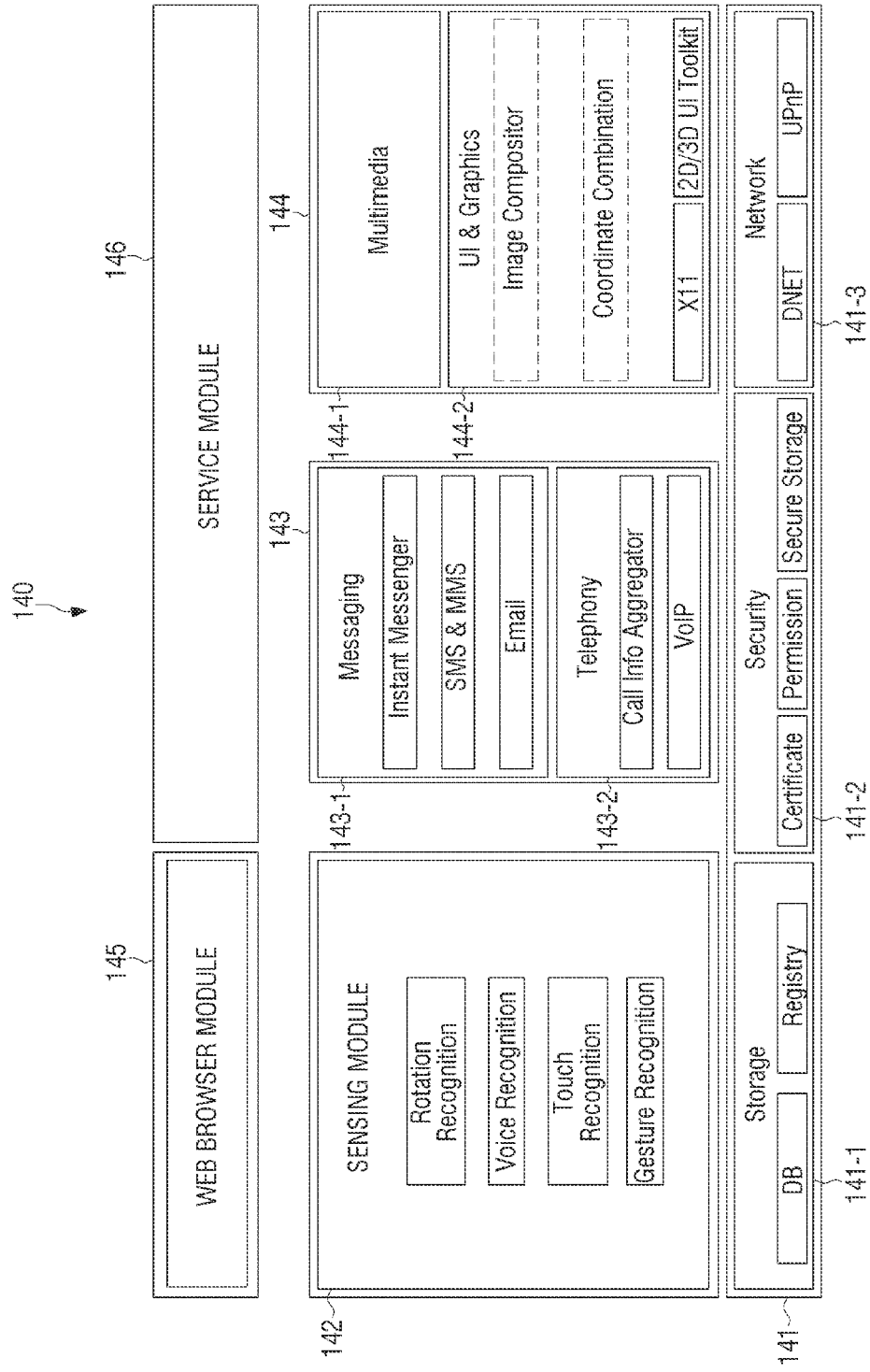
FIG. 3 is a diagram explaining a configuration of software stored in a memory, such as the memory illustrated in FIG. 2B, according to an exemplary embodiment of the present invention.

FIG. 3 is a diagram explaining a configuration of software stored in a memory, such as the memory 140 illustrated in FIG. 2B, according to an exemplary embodiment of the present invention.

Referring to FIG. 3, in the memory 140, software that includes a base module 141, a sensing module 142, a communication module 143, a presentation module 144, a web browser module 145, and a service module 146 may be stored.

The base module 141 denotes a basic module which processes signals transferred from hardware included in the user terminal apparatus 100 and transfers the processed signals to an upper-layer module. The base module 141 includes a storage module 141-1, a security module 141-2, and a network module 141-3. The storage module 141-1 is a program module that manages a DataBase (DB) and/or registries. The main CPU 133 may read various kinds of data by accessing the database in the memory 140 using the storage module 141-1. The security module 141-2 is a program module that supports hardware certification, request permission, and secure storage, and the network module 141-3 includes a modulo DNET module and a Universal Plug and Play (UPnP) module for supporting network connection.

The sensing module 142 is a module which collects information from various kinds of sensors, analyzes and manages the collected information. The sensing module 142 may include a rotation recognition module, a voice recognition module, a touch recognition module, and a gesture recognition module. In addition, sensing module 142 may include a face recognition module, a motion recognition module, and an NFC recognition module.

The communication module 143 is a module for performing communication outside the user terminal apparatus 100. The communication module 143 may include a messaging module 143-1, such as a messenger program, a Short Message Service (SMS) & Multimedia Message Service (MMS) program, and an e-mail program, and a telephony module 143-2 including a call information aggregator program module, and a Voice over Internet Protocol (VoIP) module.

The presentation module 144 is a module for configuring a display screen. The presentation module 144 includes a multimedia module 144-1 for reproducing and outputting multimedia content, and a User Interface (UI) rendering module 144-2 performing UI and graphic processing. The multimedia module 144-1 may include a player module, a camcorder module, and a sound processing module. Accordingly, the multimedia module reproduces various kinds of multimedia content to generate and reproduce the screen and sound. The UI rendering module 144-2 may include an image compositor module combining images, a coordinate combination module combining and generating coordinates on the screen on which an image is to be displayed, an X11 module receiving various kinds of events from hardware, and a 2D/3D UI tool kit providing a tool for configuring a 2-Dimensional (2D) or 3-Dimensional (3D) type UI.

The web browser module 145 denotes a module that accesses a web server by performing web browsing. The web browser module 145 may include various modules, such as a web view module configuring a web page, a download agent module performing a download, a bookmark module, and a web kit module.

The service module 146 is a module including various kinds of applications for providing various services. Specifically, the service module 146 may include various program modules, such as a navigation program, a content reproduction program, a game program, an electronic book program, a calendar program, an alarm management program, and other widgets.

Although FIG. 3 illustrates various program modules, the illustrated program modules can be partially omitted, modified, or added depending on the kind and characteristic of the user terminal apparatus 100. For example, a position based module, which support a position based service in association with the hardware such as a GPS chip, may be further implemented.

Figure 4:
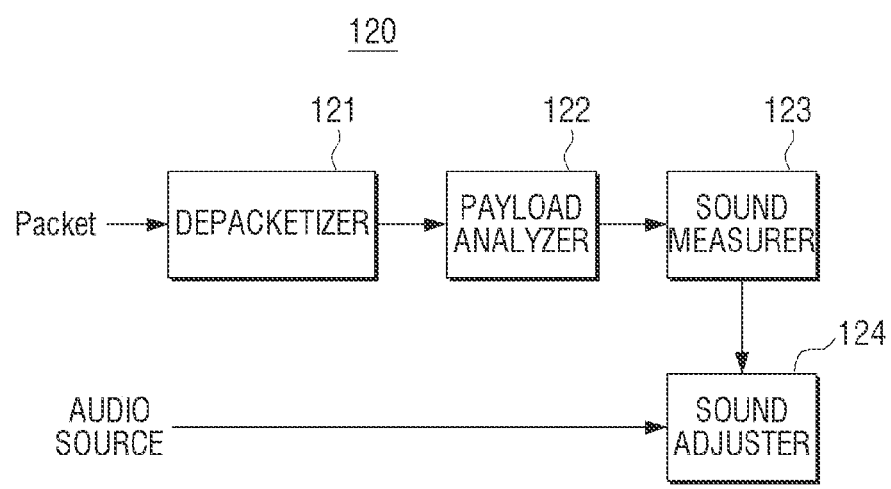
FIG. 4 is a diagram illustrating a detailed configuration of an audio processor, such as the audio processor illustrated in FIGS. 2A and 2B, according to an exemplary embodiment of the present invention.

FIG. 4 is a diagram illustrating a detailed configuration of an audio processor, such as the audio processor 120 illustrated in FIGS. 2A and 2B, according to an exemplary embodiment of the present invention.

Referring to FIG. 4, the audio processor 120 includes a depacketizer 121, a payload analyzer 122, a sound measurer 123, and a sound adjuster 124.

The depacketizer 121 depacketizes a received packet, for example, a UDP packet. Specifically, the depacketizer 121 may receive and depacketize a packet that includes a standard sound received from the electronic device 200.

The payload analyzer 122 analyzes a payload region of the depacketized packet, and extracts the standard sound included in the payload region.

The sound measurer 123 measures the level of the standard sound extracted by the payload analyzer 122. For example, the sound measurer 123 may be implemented to include a VU meter that can measure sound. Accordingly, the sound measurer 123 can measure the strength of an electric signal that transfers sound using the VU meter in the unit of dB so that the strength of the electric signal is in proportion to the volume (i.e., sound pressure level) that a person feels.

The sound adjuster 124 can adjust the sound level of the audio source to be streamed to the electronic device 200 based on the sound level measured by the sound measurer 123. Specifically, the sound adjuster 124 may be provided with a volume unification module as described above to normalize the sound level of the audio source to be output to the electronic device 200 with the same level as the reference volume unit.

In this case, the audio source may be optimized and transmitted to suit the transmission through a packet based network, such as digitalization and compression.

On the other hand, the audio processor 120 may not be implemented separately from the controller 130 as described above, but may be implemented as one function of the controller 130.

Figure 5:
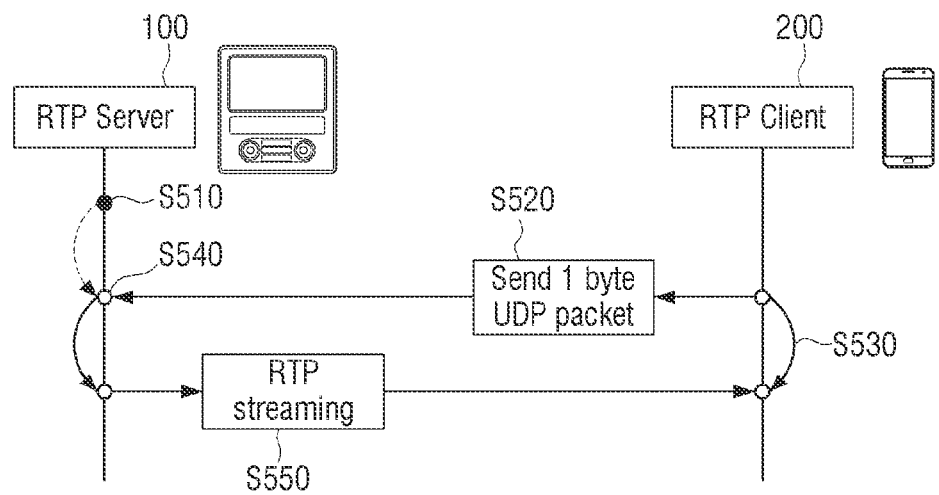
FIG. 5 is a sequential diagram explaining a method for transmitting a standard sound according to an exemplary embodiment of the present invention.

FIG. 5 is a sequential diagram explaining a method for transmitting a standard sound according to an exemplary embodiment of the present invention.

As illustrated in FIG. 5, according to an exemplary embodiment of the present invention, the standard sound may be transmitted using the RTP/RTCP protocol. However, this is merely exemplary, and any protocol that can transmit audio data is applicable with no limits.

In the case of the RTP/RTCP protocol, according to an exemplary embodiment, the user terminal apparatus 100 operates as an RTP server, and the electronic device 200 operates as an RTP client.

First, the RTP server, that is, the user terminal apparatus 100, waits for reception of a UDP packet from the RTP client, that is, the electronic device 200 in step S510.

The electronic device 200 transmits a UDP packet of one byte to a port number and an IP address allocated to the user terminal apparatus 100 in step S520. This is because the RTP packet is executed on the UDP transport protocol, and the RTP server can determine the port of the RTP client only when it receives the UDP packet from the RTP client. Here, the IP address of the RTP server can be acquired through a Tm Application Sever UPnP service. A detailed explanation thereof will be omitted.

Thereafter, the electronic device 200, which has transmitted the UDP packet of one byte to the user terminal apparatus 100, is ready to receive the RTP packet from the user terminal apparatus 100 in step S530.

If the UDP packet of one byte is received, the user terminal apparatus 100 optionally determines the port number and the IP address of the electronic device 200 in step S540.

Accordingly, the user terminal apparatus 100 can stream the audio source to the electronic device 200 in step S550.

On the other hand, the UDP packet of one byte that is transmitted to the user terminal apparatus 100 is transmitted to determine the port, and actually has an arbitrary meaningless value. According to the present invention, the standard sound for determining the reference volume unit of the electronic device 200 is included in the payload region of the corresponding UDP packet to be transmitted. Accordingly, it becomes possible to transmit the standard sound for determining the reference volume unit of the electronic device 200, as being compatible with the existing transport protocol.

However, this refers to an exemplary embodiment of the present invention, and according to another exemplary embodiment of the present invention, it is also possible to transmit the standard sound without using the corresponding UDP packet.

In the above-described exemplary embodiment, it is exemplified that the standard sound for determining the reference volume unit is transmitted through the UDP packet. However, even in the case where the electronic device 200 transmits the reference volume unit according to another exemplary embodiment of the present invention, the corresponding UDP packet can be used.

On the other hand, in the case of the identification information of the electronic device 200, there is a high possibility that the user terminal apparatus 100 already knows the identification information from the communication connection, and thus the identification information may not be separately transmitted. According to circumstances, the identification information may be transmitted using the UDP packet.

Figure 6A:
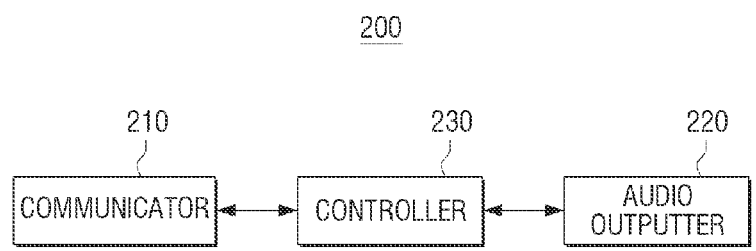
FIG. 6A is a block diagram illustrating a configuration of an electronic device according to an exemplary embodiment of the present invention.

FIG. 6A is a block diagram illustrating a configuration of an electronic device according to an exemplary embodiment of the present invention.

According to the configuration illustrated in FIG. 6A, the electronic device 200 includes a communicator 210, an audio outputter 220, and a controller 230.

The communicator 210 performs communication with the user terminal apparatus 100.

More specifically, the communicator 210 may perform communication with the user terminal apparatus 100 according to various wired/wireless communication methods, such as Wireless Fidelity (Wi-Fi), Bluetooth, Universal Serial Bus (USB), etc.

The audio outputter 220 outputs various audio signals. In particular, the audio outputter 220 may output an audio signal that is received in a streaming method from the user terminal apparatus 100. In this case, the audio outputter 220 may be implemented by a speaker, but is not limited thereto. It is also possible that the audio outputter 220 is implemented by an output terminal connected to an earphone or the like.

The controller 230 controls the operation of the electronic device 200.

More particularly, the controller 230 may operate to receive and output the audio source, of which the sound level has been adjusted based on the reference volume unit of the electronic device 200, from the user terminal apparatus 100 in the streaming method.

According to an exemplary embodiment, the controller 230 may transmit the standard sound to determine the reference volume unit to the user terminal apparatus 100 so that the user terminal apparatus 100 determines the reference volume unit of the electronic device 200. Here, the standard sound may be a sound having a constant sound level, such as a beep sound.

More specifically, if a preset event occurs, the controller 230 may transmit the standard sound using the payload region of the UDP packet. Here, the preset event may be a case where a UDP packet of one byte is transmitted to perform the RTP communication connection for transmitting the RTP packet.

In another exemplary embodiment, the controller 230 may transmit the pre-stored reference volume unit to the user terminal apparatus 100.

Further, in still another exemplary embodiment, the controller 230 may transmit the identification information of the electronic device 200 to the user terminal apparatus 100. In this case, the user terminal apparatus 100 may pre-store the reference volume unit that is mapped on the identification information of the electronic device 200, and determine the reference volume unit that is mapped on the identification information.

As described above, according to various exemplary embodiments, if the reference volume unit is determined, the user terminal apparatus 100 adjusts the sound level based on the determined reference volume unit and transmits the adjusted sound level to the electronic device 200.

Figure 6B:
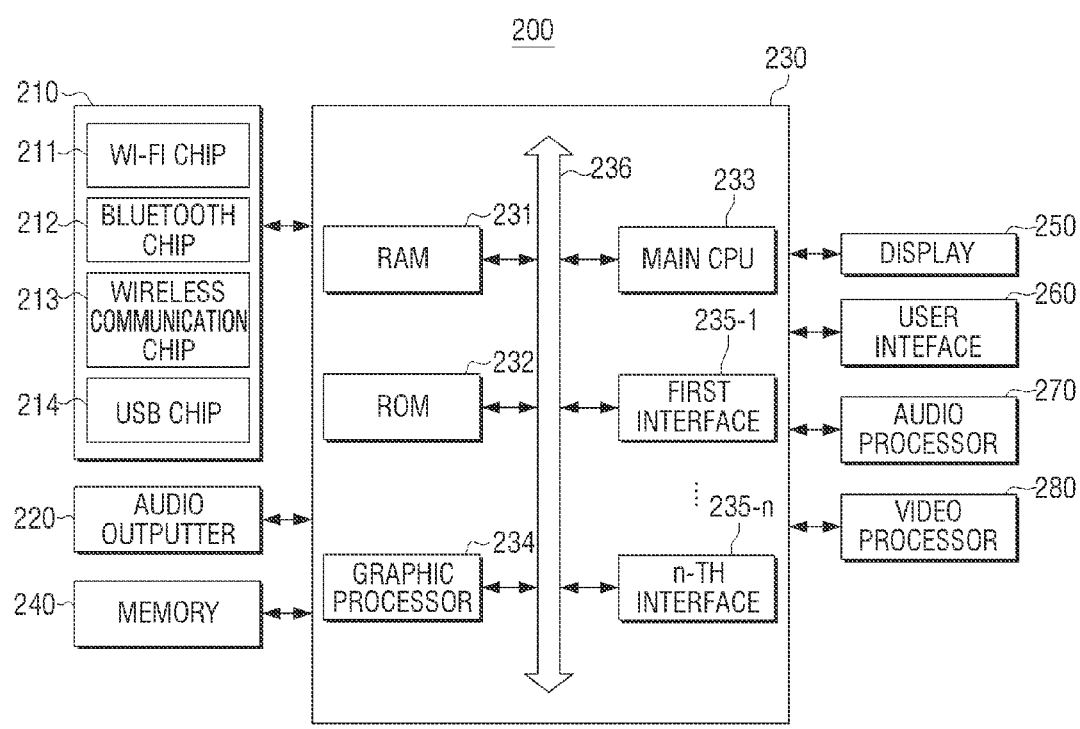
FIG. 6B is a block diagram illustrating a detailed configuration of an electronic device, such as the electronic device illustrated in FIG. 6A, according to an exemplary embodiment of the present invention.

FIG. 6B is a block diagram illustrating a detailed configuration of an electronic device, such as the electronic device illustrated in FIG. 6A, according to an exemplary embodiment of the present invention.

Referring to FIG. 6B, the electronic device 200 includes a communicator 210, an audio outputter 220, a controller 230, a memory 240, a display 250, a user interface 260, an audio processor 270, and a video processor 280. With respect to portions that are duplicate to the constituent elements illustrated in FIG. 6A among the constituent elements illustrated in FIG. 6B, a detailed explanation thereof will be omitted. Further, the constituent elements having the same configurations and names as those illustrated in FIG. 2B among the constituent elements illustrated in FIG. 6B perform substantially the same functions, and thus a detailed explanation of the portions that are not related to the present invention will be omitted.

However, in the same manner as FIG. 2B, FIG. 6B shows an example of the detailed configuration included in the electronic device 200, and according to the exemplary embodiments, a part of the constituent elements illustrated in FIG. 6B may be omitted or changed, and other constituent elements may be further added.

The communicator 210 is a configuration that performs communication with the user terminal apparatus 100 according to various types of communication methods. The communicator 210 includes various communication chips, such as a Wi-Fi chip 221, a Bluetooth chip 212, a wireless communication chip 213, and a USB chip 214.

The controller 230 includes a RAM 231, a ROM 132, a main CPU 233, a graphic processor 234, first to n-th interfaces 235-1 to 235-n, and a bus 236.

The operation of the controller 230 as described above may be performed by a program stored in the memory 240. The memory 240 may store an Operating System (O/S) software module for driving the electronic device 200, various kinds of applications, various kinds of data input or set during execution of the applications, and various pieces of data such as content.

More particularly, according to an exemplary embodiment of the present invention, the memory 240 may store the reference volume unit of the electronic device 200. In addition, various software modules stored in the memory 240 are the same as those of the configuration illustrated in FIG. 3, and thus a detailed description thereof will be omitted.

The display 250 displays a screen. For example, the display 250 may display a reproduction screen of the streamed video source in the case where the video source from the user terminal apparatus 100 is streamed.

The user interface 260 receives various user commands. For example, the user interface 260 may receive user commands for performing communication with the electronic device 200 and user commands for adjusting the level of the audio signal output through the audio outputter 220.

The audio processor 270 functions to process the audio source received from the user terminal apparatus 100. Specifically, the audio processor 270 performs decoding, amplification, and noise filtering with respect to the received audio source.

More particularly, the audio processor 270 may amplify the audio signal output through the audio outputter 220 according to the user command input through the user interface 260. Accordingly, the audio processor 27 may be provided with, for example, an amplifier for amplifying sound frequencies.

The video processor 280 is a constituent element that processes video data. For example, the video processor 280 may perform various image processes, such as decoding, scaling, noise filtering, frame rate conversion, and resolution conversion for the video data that is received from the user terminal apparatus 100 in the streaming method.

On the other hand, the detailed configuration of the controller 230 and the various modules stored in the memory 240 are similar to those as described with reference to the controller 130 and the memory 140 in the user terminal apparatus 100 illustrated in FIG. 2B, and thus a detailed description thereof will be omitted.

Figure 7:
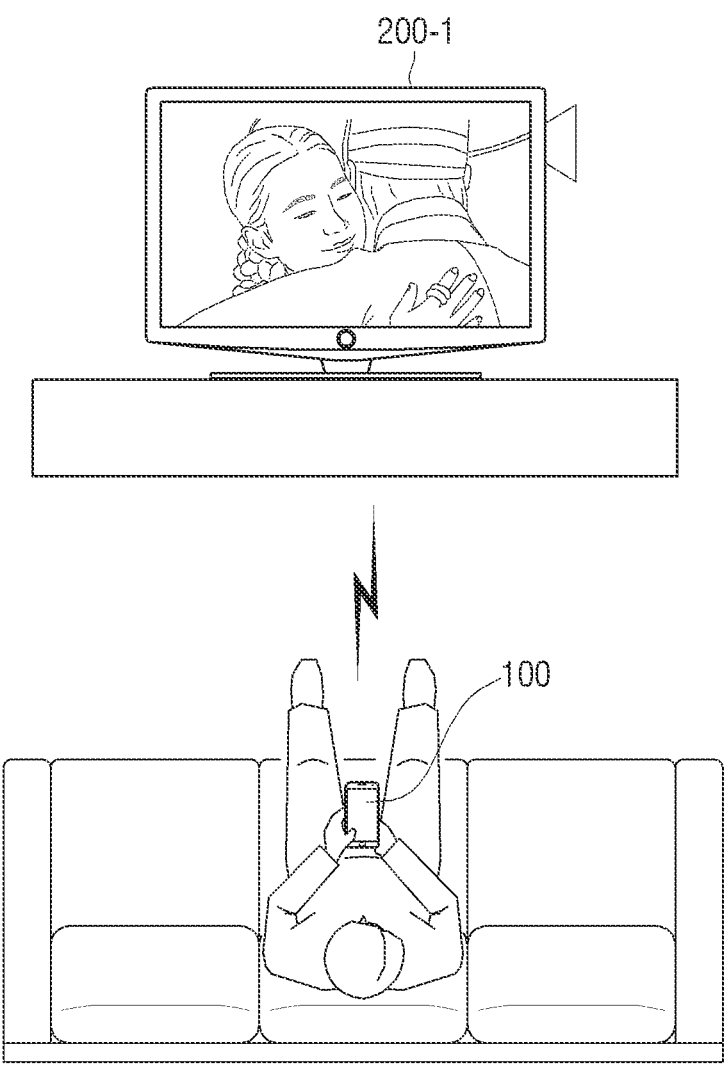
FIG. 7 is a view explaining a configuration of a content sharing system according to another exemplary embodiment of the present invention.

FIG. 7 is a view explaining a configuration of a content sharing system according to another exemplary embodiment of the present invention.

Referring to FIG. 7, the present invention can be applied to a home network system.

As illustrated, if it is intended to view moving image content that is reproduced by the user terminal apparatus 100 as illustrated through another device such as a digital TV 200-1, the present invention as described above can be applied to the transmission of the audio signal.

That is, the user terminal apparatus 100 may adjust the sound level of the audio signal based on the reference volume unit of the digital TV 200-1 and transmit the audio signal to the digital TV 200-1. Since the detailed method for adjusting the sound level corresponds to the contents as described above with reference to FIGS. 1 to 6B, a detailed description thereof will be omitted.

Figure 8:
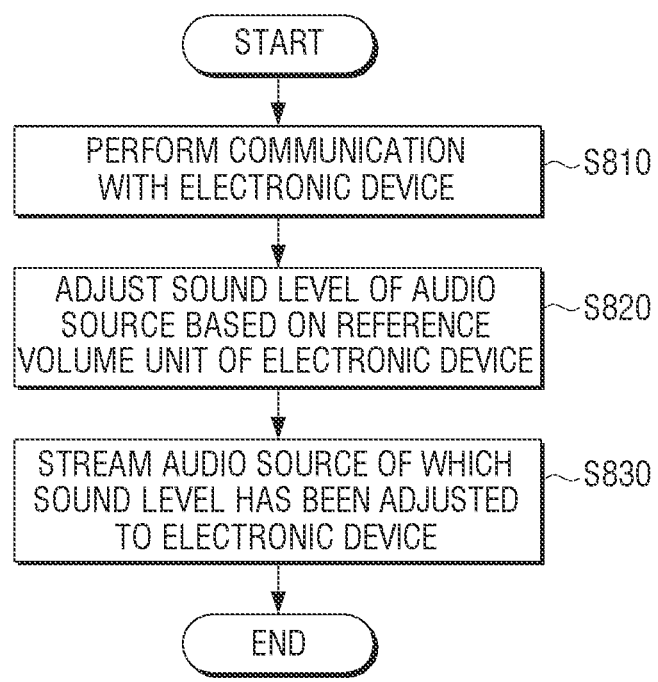
FIG. 8 is a flowchart illustrating a method for controlling a user terminal apparatus according to an exemplary embodiment of the present invention.

FIG. 8 is a flowchart illustrating a method for controlling a user terminal apparatus according to an exemplary embodiment of the present invention.

Referring to FIG. 8, the user terminal apparatus 100 first performs communication with the electronic device 200 in step S810.

Then, the user terminal apparatus 100 adjusts the sound level of the audio source based on the reference volume unit of the electronic device 200 in step S820.

Thereafter, the user terminal apparatus 100 streams the audio source of which the sound level has been adjusted to the electronic device 200 in step S830.

Specifically, in step S820, the user terminal apparatus 100 may measure the level of the standard sound received from the electronic device 200, determine the reference volume unit based on the measured value, and then adjust the sound level of the audio source based on the determined reference volume unit.

Further, in step S820, the user terminal apparatus 100 may receive the reference volume unit transmitted from the electronic device 200, and adjust the sound level of the audio source based on the received reference volume unit. In this case, the electronic device 200 may pre-store its own reference volume unit.

Further, in step S820, the user terminal apparatus 100 may receive the identification information from the electronic device 200, search for the reference volume unit that is mapped on the identification information, and then adjust the sound level of the audio source based on the searched reference volume unit. In this case, the user terminal apparatus 100 may store the reference volume unit that corresponds to the identification information of the electronic device 200.

Figure 9:
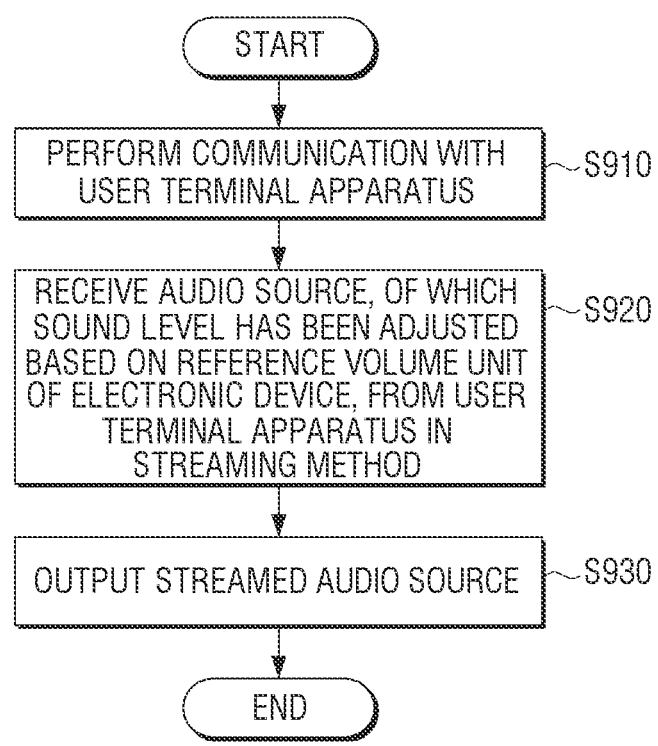
FIG. 9 is a flowchart illustrating a method for controlling an electronic device according to an exemplary embodiment of the present invention.

FIG. 9 is a flowchart illustrating a method for controlling an electronic device according to an exemplary embodiment of the present invention.

Referring to FIG. 9, the electronic device 200 first performs communication with the user terminal apparatus 100 in step S910.

Then, the electronic device 200 may receive the audio source, of which the sound level has been adjusted, from the user terminal apparatus 100 in the streaming method based on the reference volume unit of the electronic device 200 in step S920.

Thereafter, the electronic device 200 outputs the received audio source in step S930.

Further, the electronic device 200 may transmit the standard sound to determine the reference volume unit to the user terminal apparatus 100. In this case, in step S920, the electronic device 200 may receive the audio source, of which the sound level has been adjusted, based on the reference volume unit determined according to the measured value of the standard sound.

In this case, the audio source may be received in a RTP packet form, and the standard sound may be transmitted to the user terminal apparatus 100 using the UDP packet.

Further, if the electronic device 200 knows its own reference volume unit, the electronic device 200 may transmit the reference volume unit to the user terminal apparatus 100 without transmitting the pre-stored standard sound. In this case, in step S920, the electronic device 200 may receive the audio source, of which the sound level has been adjusted, based on the reference volume unit transmitted to the user terminal apparatus 100.

Further, if the user terminal apparatus 100 knows the reference volume information of the electronic device 100, the electronic device 200 may transmit the identification information of the electronic device 200 to the user terminal apparatus 100. In this case, in step S920, the electronic device 200 may receive the audio source, of which the sound level has been adjusted, based on the reference volume unit determined by the identification information.

Figure 10:
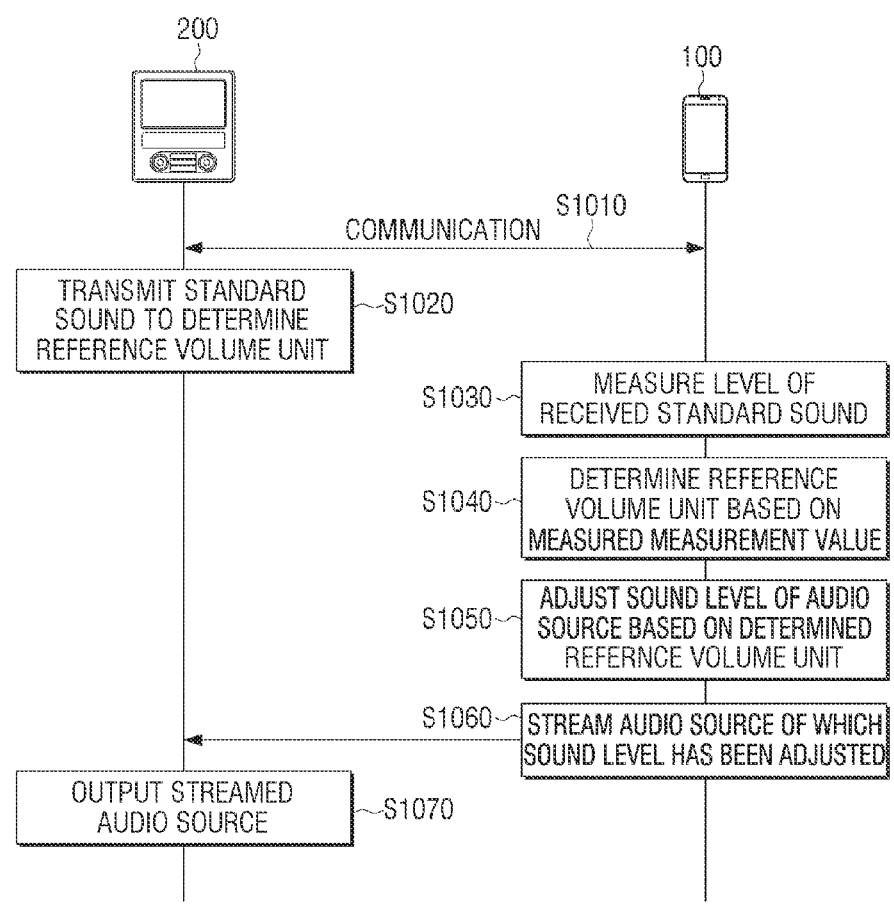
FIG. 10 is a sequential diagram explaining operations between a user terminal apparatus and an electronic device according to an exemplary embodiment of the present invention.

FIG. 10 is a sequential diagram explaining operations between a user terminal apparatus and an electronic device according to an exemplary embodiment of the present invention.

FIG. 10 is to explain the operation according to one exemplary embodiment (exemplary embodiment of the first method explained with reference to FIGS. 2A and 2B) of the present invention, and a detailed description of the operation according to the exemplary embodiments of the second and third methods explained with reference to FIGS. 2A and 2B will be omitted.

Referring to FIG. 10, first, communication between the user terminal apparatus 100 and the electronic device 200 is performed in step S1010. Here, the communication may be performed in various communication methods, such as Wi-Fi, Bluetooth, 3G, 4G, USB, etc.

Then, the electronic device 200 transmits the standard sound to determine the reference volume unit to the user terminal apparatus 100 in step S1020.

The user terminal apparatus 100 measures the level of the received standard sound in step S1030, and determines the reference volume unit based on the measured value in step S1040.

Then, the user terminal apparatus 100 adjusts the sound level of the audio source to be transmitted to the electronic device 200 based on the determined reference volume unit in step S1050.

Thereafter, the user terminal apparatus 100 transmits (e.g., streams) the audio source, of which the sound level has been adjusted, to the electronic device 200 in the streaming method in step S1060, and then the electronic device 200 outputs the received audio source in the streaming method in step S1070.

As described above, according to exemplary embodiments of the present invention, additional volume adjustment can be avoided after transmission of the audio source, and thus user convenience can be improved.

Further, audio shock, which may occur when the audio source is transmitted to an external device in the streaming method at a high level, can be prevented.

On the other hand, the control method according to various exemplary embodiments as described above may be implemented by a program and may be provided to the user terminal apparatus 100 or the electronic device 200.

As an example, a non-transitory computer readable medium, which stores a program for performing communication with the electronic device 200, for adjusting a sound level of an audio source based on a reference volume unit of the electronic device 200, and for transmitting the audio source, of which the sound level has been adjusted, to the electronic device 200 in a streaming method, may be provided to the user terminal apparatus 100.

As another example, a non-transitory computer readable medium, which stores a program for performing communication with the user terminal apparatus 100, for receiving an audio source, of which a sound level has been adjusted based on a reference volume unit of the electronic device 200, from the user terminal apparatus 100 in a streaming method, and for outputting the received audio source, may be provided to the electronic device.

The non-transitory computer readable medium is not a medium that stores data for a short period, such as a register, a cache, or a memory, but denotes a medium which semi-permanently stores data and is readable by a device. Specifically, various applications and programs as described above may be stored and provided in the non-transitory computer readable medium, such as, a Compact Disc (CD), a Digital Versatile Disc (DVD), a hard disc, a Blu-ray disc, a USB memory stick, a memory card, and a ROM.

While the invention has been shown and described with reference to certain exemplary embodiments thereof, it will be understood by those skilled in the art that various changes in form and detail may be made therein without departing from the spirit and scope of the invention as defined by the appended claims and their equivalents.

What is claimed is:

1. A user terminal apparatus connected to an electronic device, the user terminal apparatus comprising:
  a communicator that performs communication with the electronic device;
  an audio processor that processes an audio source to be transmitted to the electronic device; and
  a processor configured to control the audio processor to:
    determine a reference volume unit based on a measurement value of a standard sound, the standard sound received from the electronic device,
    adjust a sound level of the audio source based on the determined reference volume unit of the electronic device, and
    control the adjusted audio source to be transmitted to the electronic device in a streaming method,
  wherein the reference volume unit is a volume that corresponds to a Volume Unit (VU) at an audio output terminal of the electronic device.

2. The user terminal apparatus as claimed in claim 1, wherein the audio processor comprises a sound measurer that measures the level of a standard sound received from the electronic device, and
  wherein the audio processor determines the reference volume unit based on a measurement value measured by the sound measurer, and
  wherein the processor controls the audio processor to adjust the sound level of the audio source based on the determined reference volume unit.

3. The user terminal apparatus as claimed in claim 1, wherein the communicator receives the reference volume unit transmitted from the electronic device before transmitting the audio source to the electronic device, and
  wherein the processor controls the audio processor to adjust the sound level of the audio source based on the received reference volume unit.

4. The user terminal apparatus as claimed in claim 1, further comprising a memory that maps and stores device identification information and the reference volume unit,
  wherein, if the identification information is received from the electronic device, the processor searches for the reference volume unit that is mapped on the identification information in the memory, and controls the audio processor to adjust the sound level of the audio source based on a found reference volume unit.

5. An electronic device connected to a user terminal apparatus, the electronic device comprising:
  a communicator that performs communication with the user terminal apparatus;
  an audio outputter that outputs an audio signal; and
  a processor that operates to receive an audio source, of which a sound level has been adjusted based on a reference volume unit of the electronic device, from the user terminal apparatus in a streaming method, and to output the received audio source,
  wherein the processor operates to:
    transmit a standard sound to determine the reference volume unit to the user terminal apparatus, and
    receive the audio source, of which the sound level has been adjusted based on the reference volume unit determined according to a measurement value of the standard sound, from the user terminal apparatus,
  wherein the reference volume unit is a volume that corresponds to a Volume Unit (VU) at an audio output terminal of the electronic device.

6. The electronic device as claimed in claim 5, wherein the processor operates to:
  receive the audio source in a Real time Transport Protocol (RTP) packet form, and
  transmit the standard sound using a User Datagram Protocol (UDP) packet before the audio source is received.

7. The electronic device as claimed in claim 5, further comprising a memory that stores the reference volume unit, wherein the processor operates to transmit the reference volume unit stored in the memory to the user terminal apparatus, and to receive the audio source, of which the sound level has been adjusted based on the reference volume unit, from the user terminal apparatus.

8. The electronic device as claimed in claim 5, wherein the processor operates to transmit identification information of the electronic device to the user terminal apparatus, and to receive the audio source, of which the sound level has been adjusted based on the reference volume unit determined by the identification information, from the user terminal apparatus.

9. The electronic device as claimed in claim 5, wherein the electronic device comprises a head unit device of a vehicle, and the user terminal apparatus comprises a mobile terminal.

10. A method for controlling a user terminal apparatus connected to an electronic device, the method comprising:
performing communication with the electronic device;
measuring a level of a standard sound received from the electronic device;
determining a reference volume unit based on the measured measurement value;
adjusting a sound level of an audio source based on the determined reference volume unit of the electronic device; and
transmitting the audio source, of which the sound level has been adjusted, to the electronic device in a streaming method,
wherein the reference volume unit is a volume that corresponds to a Volume Unit (VU) at an audio output terminal of the electronic device.

11. The method as claimed in claim 10, wherein the adjusting of the sound level of the audio source comprises:
measuring a level of a standard sound received from the electronic device;
determining the reference volume unit based on the measured measurement value; and
adjusting the sound level of the audio source based on the determined reference volume unit.

12. The method as claimed in claim 10, wherein the adjusting of the sound level of the audio source comprises:
receiving the reference volume unit transmitted from the electronic device; and
adjusting the sound level of the audio source based on the received reference volume unit.

13. The method as claimed in claim 10, wherein the adjusting of the sound level of the audio source comprises:
receiving identification information from the electronic device;
searching for the reference volume unit that is mapped on the identification information; and
adjusting the sound level of the audio source based on a found reference volume unit.

14. A method for controlling an electronic device connected to a user terminal apparatus, the method comprising:
performing communication with the user terminal apparatus;
transmitting a standard sound to determine a reference volume unit to the user terminal apparatus; and
receiving an audio source, of which a sound level has been adjusted based on the reference volume unit of the electronic device, from the user terminal apparatus in a streaming method, wherein the receiving of the audio source comprises:
receiving, from the electronic device, the audio source of which the sound level has been adjusted based on the reference volume unit determined according to a measurement value of the standard sound, and
outputting the received audio source,
wherein the reference volume unit is a volume that corresponds to a Volume Unit (VU) at an audio output terminal of the electronic device.

15. The method as claimed in claim 14,
wherein the receiving of the audio source comprises receiving the audio source in a Real time Transport Protocol (RTP) packet form, and
wherein the transmitting of the standard sound to the user terminal apparatus comprises transmitting the standard sound using a User Datagram Protocol (UDP) packet before the audio source is received.

16. The method as claimed in claim 14, further comprising:
transmitting identification information of the electronic device to the user terminal apparatus,
wherein the receiving the audio source comprises receiving the audio source of which the sound level has been adjusted based on the reference volume unit determined by the identification information.

17. The method as claimed in claim 14, wherein the electronic device comprises a head unit device of a vehicle, and the user terminal apparatus comprises a mobile terminal.

* * * * *